(12) United States Patent
Chacko

(10) Patent No.: US 6,417,739 B1
(45) Date of Patent: Jul. 9, 2002

(54) LOOP FILTER

(75) Inventor: Prakash Chacko, Penang (MY)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/814,617

(22) Filed: Mar. 23, 2001

(51) Int. Cl.[7] .............................................. H03L 7/093
(52) U.S. Cl. ............................. 331/17; 331/14; 327/157
(58) Field of Search .............................. 331/1 A, 8, 14, 331/16–18, 25, DIG. 2; 327/156–159; 360/51; 375/376; 455/260

(56) References Cited

U.S. PATENT DOCUMENTS 5,739,874 A * 4/1998 Badger et al. .............. 348/731
5,774,023 A 6/1998 Irwin ........................... 331/17

* cited by examiner

Primary Examiner—David Mis
(74) Attorney, Agent, or Firm—Frank M. Scutch, III

(57) ABSTRACT

A loop filter (4) having an adapt input (26), a normal input (24) and an output (23) is disclosed. Each of the inputs (24, 26) is connectable to mutually exclusively operable current sources to operate the loop filter (4) in an adapt and a normal mode respectively for controlling a voltage controlled oscillator (14) connectable to the output. The loop filter (4) includes a circuit (27) which when operated in the normal mode is connected between the normal input (24) and the output (23) to introduce a pole (P3) to a normal mode frequency response (32) of the loop filter (4). When switched to operate in the adapt mode the first circuit (27) becomes connected in series between the output (23) and a signal ground to introduce a zero to an adapt mode frequency response of the loop filter (4).

8 Claims, 2 Drawing Sheets

LOOP FILTER

FIELD OF THE INVENTION

The present invention relates, in general, to a loop filter in a phase lock loop (PLL), and more particularly, to such a loop filter responsive to two input current sources to operate in an adapt and a normal mode respectively.

BACKGROUND OF THE INVENTION

A phase lock loop (PLL) typically includes a loop filter that is operated in an adapt mode and a normal mode. In the adapt mode, the loop filter is designed to have a wide-bandwidth frequency response. The loop filter is operated in the adapt mode for a predetermined period of time so as to enable it to quickly steer an output frequency of the PLL closer to a final value.

After the predetermined period, the loop filter is switched to operate in the normal mode. In the normal mode, the loop filter is designed to have a narrow-bandwidth frequency response for maximum attenuation of spurious signals. U.S. Pat. No. 5,774,023 discloses such a PLL.

Current implementations of the loop filter include a resistor-capacitor (RC) circuit that introduces an additional pole in the normal mode frequency response to make its bandwidth narrow. The RC circuit however causes a problem in the adapt mode. The RC circuit introduces excessive phase shift to produce a low phase margin. A phase margin that is too low indicates that the loop filter is potentially unstable when used in a closed loop mode. The desired wide bandwidth in the adapt mode has to be compromised to increase the phase margin to an acceptable value.

One prior art loop filter includes a switch that is actuatable in the adapt mode to bypass a pole introducing circuit to reduce phase shift caused by the circuit. Such an implementation however requires an additional switch and associated control circuitry.

SUMMARY OF THE INVENTION

According to one aspect of the invention there is provided a loop filter having an adapt input, a normal input and an output. Each of said inputs is connectable to mutually exclusively operable current sources to operate said loop filter in an adapt and a normal mode respectively for controlling a voltage controlled oscillator connectable to said output. Said loop filter includes a first circuit which when operated in said normal mode is connected between said normal input and said output to introduce a pole to a normal mode frequency response of said loop filter. When switched to operate in said adapt mode said first circuit becomes connected in series between said output and a signal ground to introduce a zero to an adapt mode frequency response of said loop filter.

Preferably, said normal mode frequency response should include at least one other pole.

Suitably, said loop filter further may include a second circuit connected between said output and said signal ground for introducing said at least one other pole.

Suitably, said first circuit may include an RC circuit.

Suitably, said RC circuit may include a resistor and a capacitor.

Suitably, said resistor is connected in series between said normal input and said output and said capacitor is connected between said normal input and said signal ground.

Preferably, said second circuit should include a second capacitor and a low current damping resistor connected in parallel with said second pole filter capacitor to form an RC parallel connection having two nodes. A first of said two nodes is connected to said output and a second of said two nodes is connected to said adapt input. Said second circuit further includes a loop filter capacitor and a high current damping resistor connected in series with said loop filter capacitor to form a series connection, said series connection being connected between said second of said two nodes and said signal ground.

BRIEF DESCRIPTION OF THE DRAWINGS

In order that the invention may be readily understood and put into practical effect, reference will now be made to a preferred embodiment as illustrated with reference to the accompanying drawings in which.

DETAILED DESCRIPTION OF THE PREFERRED EMBODIMENTS

Figure 1:
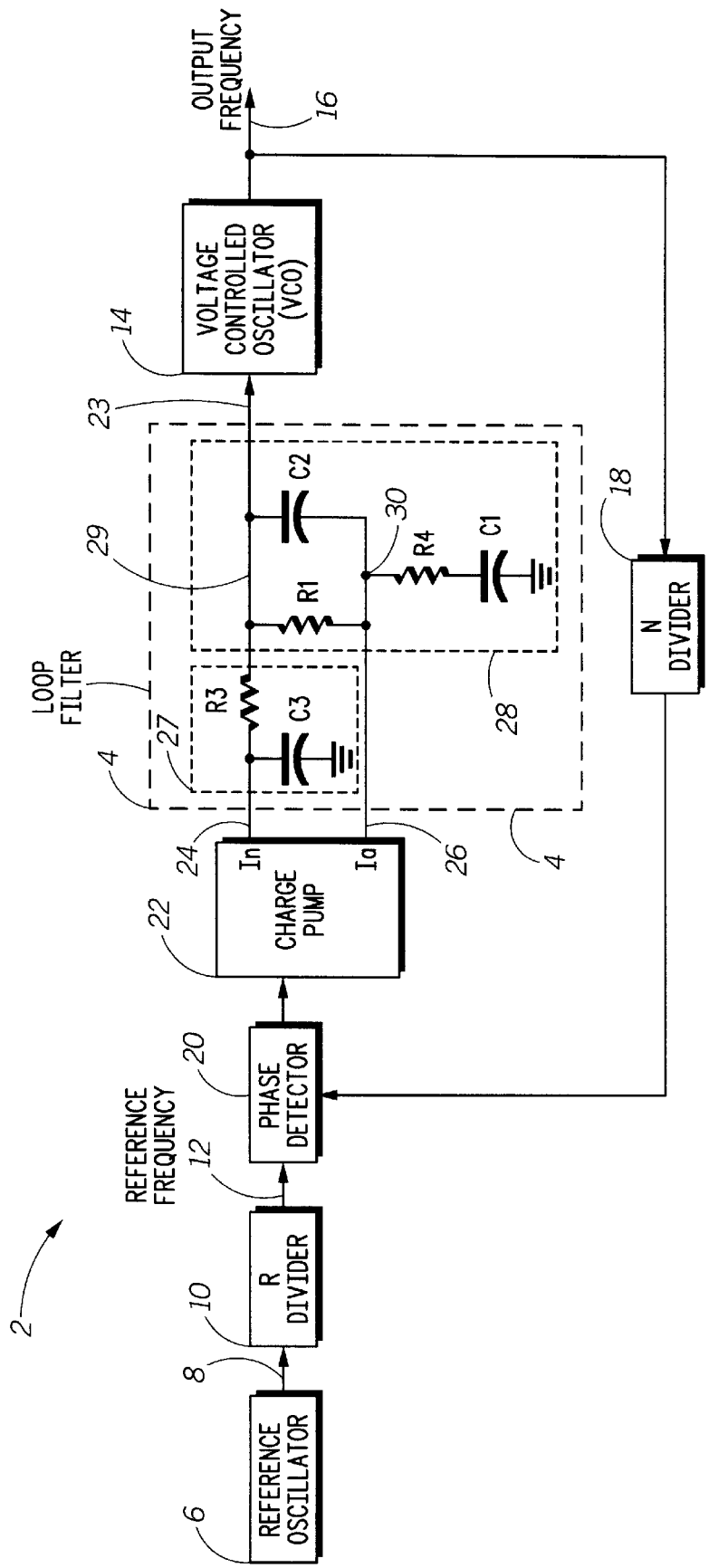
FIG. 1 is a block diagram of a phase lock loop including a loop filter according to the present invention.

FIG. 1 is a block diagram of a phase lock loop 2 including a loop filter 4 according to the present invention. The PLL 2 is driven by an accurate frequency source, such as a reference oscillator 6. The output of the frequency source is an oscillator frequency 8. The oscillator frequency 8 is divided by a first frequency divider 10. The first frequency divider 10 divides by an integer "R" to obtain a step size or reference frequency 12.

A voltage control oscillator (VCO) 14 generates an output frequency 16. The output frequency 16 is divided by an integer "N" by a second frequency divider 18. The output of the second frequency divider 18 is substantially equal to the reference frequency 12. A phase detector (PD) 20 compares the outputs of the frequency dividers 10, 18 to generate output current pulses proportional to the error between the outputs. The current pulses from the phase detector 20 are received as input by a charge pump 22. The charge pump 22 includes current sources that produce current pulses for operating the loop filter 4 in a normal and an adapt mode. An output 23 of the-loop filter 4 is provided to the VCO 14.

The charge pump 22 has two outputs; a low current or normal output 24 and a high current or adapt output 26. The normal output 24 provides current pulses to operate the loop filter 4 in the normal mode for obtaining a narrow bandwidth. The adapt output 26 applied midway to the loop filter 4 provides output current pulses to operate the loop filter 4 in the adapt mode for obtaining a wider bandwidth. At any one time, only one of the normal and adapt outputs 24, 26 is active, the other output being in an open state. The normal and adapt modes of operation are therefore mutually exclusive.

The loop filter 4 includes a first circuit 27 made up of an RC circuit. The RC circuit includes a first resistor R3 and a first capacitor C3. The resistor R3 is connected in series between the normal input 24 and the output 23 of the loop filter 4. The capacitor C3 is connected between the normal input 24 and a signal ground.

The loop filter 4 includes a second circuit 28. The second circuit 28 includes a second capacitor C2 connected in parallel with a low current damping resistor R1. A first node 29 of the R1-C2 parallel connection is connected to the output 23 of the loop filter 4. A second node 30 of the R1-C2 parallel connection is connected to the signal ground via a high current damping resistor R4 connected in series with a loop filter capacitor C1. The adapt output 26 of the charge pump 22 is connected to the second node 30.

Figure 2:
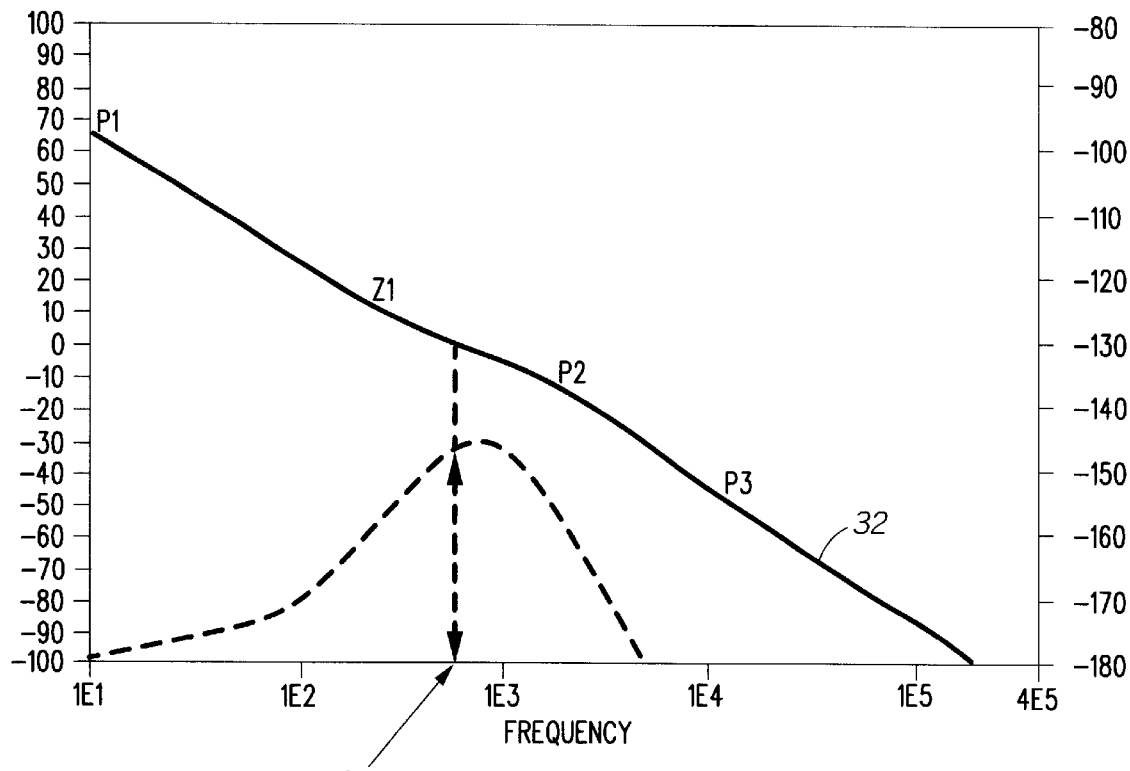
FIG. 2 is a Bode plot of a normal mode frequency response of the loop filter in FIG. 1.
Figure 3:
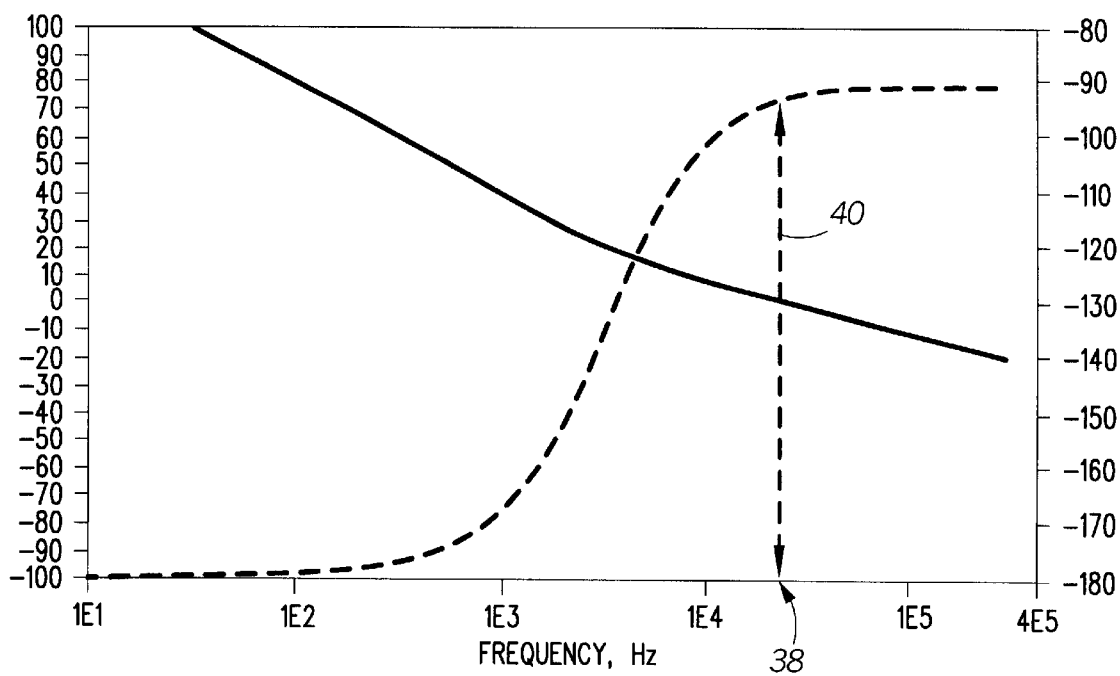
FIG. 3 is a Bode plot of an adapt mode frequency response of the loop filter in FIG. 1.

FIG. 2 and FIG. 3 show frequency responses of the loop filter 4 in the normal and adapt modes respectively. The values of the resistors R1, R3, R4 and capacitors C1, C2, C3, and other parameters of the PLL 2 for obtaining the frequency responses are given in a table below:

| R1 | 620 Ω |
|---|---|
| R3 | 560 Ω |
| R4 | 120 Ω |
| C1 | 0.47 µF |
| C2 | 0.1 µF |
| C3 | 0.047 µF |
| Output Frequency 16 | 400 Mhz |
| Oscillator Frequency 8 | 16.8 Mhz |
| VCO 14 Gain | 12 Mhz/V |
| Phase Detector 22 Gain (normal mode) | 31 uA/π |
| Phase Detector 22 Gain (adapt mode) | 31 mA/(2 * π) |

Those skilled in the art would be able to determine the values of the capacitors C1, C2, C3 and resistors R1, R3, R4 or other equivalent electrical components for obtaining a particular loop dynamics or frequency response of the loop filter 4.

An open loop gain characteristic 32 in FIG. 2 is contains three poles, P1, P2 and P3 and one zero, Z1. The poles and zero occur in the order pole P1, zero Z1, pole P2 and pole P3 at successively higher frequencies. Pole P1 is due to capacitor C1 and the VCO 14. Zero Z1 is due to the resistors R1, R4 and the capacitors C1, C2. The pole P2 is due to the resistor RI and the capacitor C2. The pole P3 is due to the resistor R3 and the capacitor C3. With such a circuit configuration and proper choice of values of the resistors and capacitors, a unity gain frequency 34 of about 560 Hz and a phase margin 36 of about 30° in its normal mode frequency response are achievable. It will be appreciated by those skilled in the art that other resistor and capacitor values may be used to achieve the same result.

In the adapt mode, the normal output 24 is open. The resistor R3 and the capacitor C3 shunt the output 23 to the signal ground. The resistor R3 and the capacitor C3 that introduced the pole P3 in the normal mode now introduce a zero instead. It is apparent to those skilled in the art that a zero does not adversely affect the phase margin. The effects of the pole P3 in the normal mode are eliminated in the adapt mode. The same circuit configuration now has a unity gain frequency 38, as shown in FIG. 3, of about 29 KHz and a phase margin 40 of about 87° in its adapt mode frequency response. These values are an improvement over that achievable with prior art loop filters. The bandwidth in the adapt mode is wide and the phase margin 36 is large.

Advantageously, the loop filter allows a designer to independently determine the frequency responses in the adapt and normal modes. With the elimination in the adapt mode of the pole effect caused by the resistor R3 and the capacitor C3, the frequency responses in the adapt mode and the normal mode can be independently determined. A large bandwidth in the adapt mode is achieved without having to be concerned with too small a phase margin brought about by a pole required to narrow the bandwidth in the normal mode.

Although the invention has been described with reference to the preferred embodiment, it is to be understood that the invention is not restricted to the embodiment described herein. For example, other equivalent electrical components may be used in place of the resistor R3 and the capacitor C3.

What is claimed is:

1. A loop filter having an adapt input, a normal input and an output, each of said inputs being connectable to mutually exclusively operable current sources to operate said loop filter in an adapt and a normal mode respectively for controlling a voltage controlled oscillator connectable to said output, said loop filter comprising:
   a first circuit which when operated in said normal mode is connected between said normal input and said output to introduce a pole to a normal mode frequency response of said loop filter, said first circuit when switched to operate in said adapt mode becomes connected in series between said output and a signal ground to introduce a zero to an adapt mode frequency response of said loop filter.

2. A loop filter according to claim 1, wherein said normal mode frequency response includes at least one other pole.

3. A loop filter according to claim 2, further comprising a second circuit connected between said output and said signal ground, said second circuit introducing said at least one other pole.

4. A loop filter according to claim 3, wherein said first circuit includes an RC circuit.

5. A loop filter according to claim 4, wherein said RC circuit includes a resistor and a capacitor.

6. A loop filter according to claim 5, wherein said resistor is connected in series between said normal input and said output and said capacitor is connected between said normal input and said signal ground.

7. A loop filter according to claim 6, wherein said second circuit includes:
   a second capacitor;
   a low current damping resistor connected in parallel with said second capacitor to form an RC parallel connection having two nodes, wherein a first of said two nodes is connected to said output and a second of said two nodes is connected to said adapt input;
   a loop filter capacitor; and
   a high current damping resistor connected in series with said loop filter capacitor to form a series connection, said series connection being connected between said second of said two nodes and said signal ground.

8. A loop filter having an adapt input, a normal input and an output, each of said inputs being connectable to mutually exclusively operable current sources to operate said loop filter in an adapt and a normal mode respectively for controlling a voltage controlled oscillator connectable to said output, said loop filter comprising:
   a first resistor connected between said normal input and said output;
   a first capacitor connected between said normal input and a signal ground;
   a second capacitor;
   a low current damping resistor connected in parallel with said second pole filter capacitor to form an RC parallel connection having two nodes, wherein a first of said two nodes is connected to said output and a second of said two nodes is connected to said adapt input;
   a loop filter capacitor; and
   a high current damping resistor connected in series with said loop filter capacitor to form a series connection, said series connection being connected between said second of said two nodes and said signal ground.

* * * * *